United States Patent [19]

Kakumu et al.

[11] Patent Number: 4,800,176
[45] Date of Patent: Jan. 24, 1989

[54] METHOD FOR FORMING CONTACT PORTION IN SEMICONDUCTOR INTEGRATED CIRCUIT DEVICES

[75] Inventors: Masakazu Kakumu; Tetsuya Asami, both of Yokohama, Japan

[73] Assignee: Kabushiki Kaisha Toshiba, Kawasaki, Japan

[21] Appl. No.: 183,138

[22] Filed: Apr. 19, 1988

[30] Foreign Application Priority Data

May 29, 1987 [JP] Japan ............................ 62-133797

[51] Int. Cl.$^4$ ........................................ H01L 21/283
[52] U.S. Cl. .................................. 437/193; 437/192;
  437/200; 437/203; 437/228; 437/195; 437/238;
  357/71
[58] Field of Search ............... 437/192, 200, 193, 203,
  437/238, 228, 195; 357/67, 71; 156/643

[56] References Cited

U.S. PATENT DOCUMENTS

| | | | |
|---|---|---|---|
| 4,518,629 | 5/1985 | Jench | 427/89 |
| 4,541,892 | 9/1985 | Jench | 156/643 |
| 4,614,563 | 9/1986 | Kubo | 156/643 |
| 4,624,864 | 11/1986 | Haztmann | 427/89 |

OTHER PUBLICATIONS

Maeda et al., "Highly Reliable One-Micron-Rule Interconnection Utilizing TiN Barrier Metal," *IEDM*, pp. 610–613, 1985.

Gardner et al., "Layered and Homogeneous Films of Aluminum and Aluminum/Silicon with Titanium and Tungsten for Multilevel Interconnects," *IEEE Transactions on Electron Devices*, vol. ED-32, No. 2, pp. 174'4 183, Feb. 1985.

*Primary Examiner*—Brian E. Hearn
*Assistant Examiner*—T. N. Quach
*Attorney, Agent, or Firm*—Finnegan, Henderson, Farabow, Garrett & Dunner

[57] ABSTRACT

A method of manufacturing semiconductor devices according to the present invention includes the steps of forming an element isolation region on the main surface of a semiconductor substrate of a first conductivity type, forming a high impurity concentration layer of a second conductivity type in the surface area of a portion of the semiconductor substrate defined by the element isolation region, and forming a first insulation film on the entire surface of the resultant semiconductor structure. Thereafter, a contact hole is formed in the first insulation film which is formed on the high impurity concentration layer, a semiconductor layer containing an impurity of the same conductivity type as the high impurity concentration layer is formed on the first insulation film, and a second insulation film is formed on the semiconductor layer. After this, a planarization film is formed on the entire surface of the second insulation film and is then selectively removed by anisotropic etching, to leave part of the planarization film filling the contact hole. Then, the portion of the planarization film exposed by the anisotropic etching is removed, a metal layer is formed on the entire surface of the resultant semiconductor structure, and the metal layer and semiconductor layer are patterned to form a laminated structure of a wiring layer.

20 Claims, 9 Drawing Sheets

METHOD FOR FORMING CONTACT PORTION IN SEMICONDUCTOR INTEGRATED CIRCUIT DEVICES

BACKGROUND OF THE INVENTION

1. Field of the Invention

This invention relates to a method for manufacturing semiconductor devices, and more particularly to a method for forming a contact portion between a semiconductor substrate (high impurity concentration layer) and a wiring layer or between upper and lower wiring layers in miniaturized semiconductor integrated circuit devices.

2. Description of the Related Art

Figure 1A:
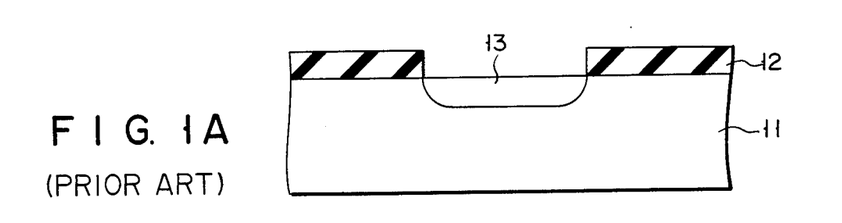
FIGS. 1A to 1C are cross-sectional views showing a prior art method of manufacturing semiconductor devices.
Figure 1B:
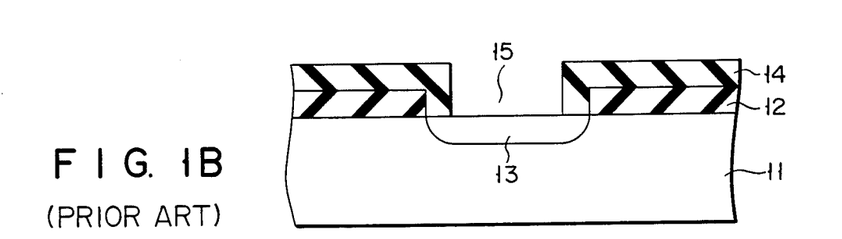
Figure 1C:
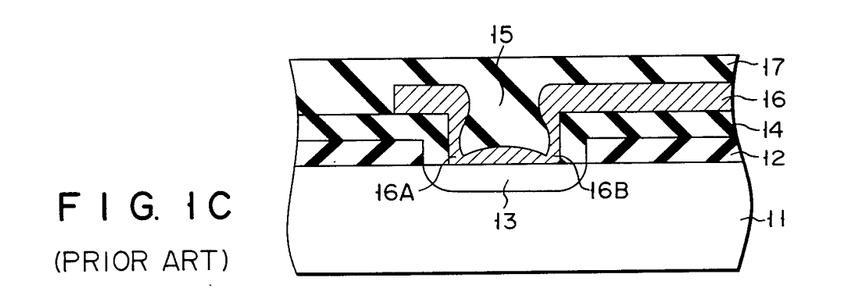

In general, in order to form a contact portion between a semiconductor substrate (high impurity concentration layer) and a wiring layer in semiconductor integrated circuit devices, the manufacturing steps shown in FIGS. 1A to 1C are used. First, element isolation region 12 is formed on the main surface of silicon substrate 11, by means of the element isolation technique as shown in FIG. 1A. Then, an impurity is doped into silicon substrate 11 by way of an ion implantation technique, with element isolation region 12 used as a mask, to form high impurity concentration region 13. An N-type impurity (donor) or a P-type impurity (acceptor) is used as the impurity for forming high impurity concentration region 13 when silicon substrate 11 is of P-type or N-type, respectively. Next, after CVD-$SiO_2$ film 14 is formed on the entire surface of the resultant structure, contact hole 15 is formed in CVD-$SiO_2$ film 14 by using a photolithographic method. Thus, a semiconductor structure as shown in FIG. 1B is obtained. Then, an Al—Si layer is formed on the entire surface of the semiconductor structure by using a sputtering method, and wiring layer 16 is formed by using the photolithographic method. Further, passivation film 17 is formed on the entire surface of the semiconductor structure, to complete the wiring process, thus forming a semiconductor structure as shown in FIG. 1C.

In the method of forming the contact portions as described above, various problems relating to the electrical characteristics and reliability of the contact portion may occur, as are described below with reference to items (1) to (3).

(1) The contact resistance increases in inverse proportion to the area of the contact in the case where the contact is made small in size. When wiring layer 16 is formed of Al—Si as described above, Si atoms in the Al—Si will be precipitated at the interface between silicon substrate 11 and wiring layer 16 during the heat treatment process (at about 450° C.), which is effected to remove the process damage induced by various process steps, thus reducing the effective area of the contact. Process damages will occur when plasma and reactive ion etching are done or an impurity is ion-implanted to form high impurity concentration layer 13 or when an impurity is ion-implanted to form semiconductor elements (not shown) at the peripheral circuit. Therefore, it is necessary that a heat treatment process be effected in order to reduces damage such as interface state. This heat treatment, however, results in a further increase in the contact resistance. An increase in the contact resistance becomes conspicuous when the contact area is made smaller than 1 $\mu m^2$. Further, aluminum in wiring layer 16 may sometimes absorbs Si atoms in silicon substrate 11, thus breaking the PN junction between substrate 11 and impurity layer 13.

(2) When the contact is made small in size, the step coverage of wiring layer (Al—Si) 16 becomes poor and the flatness of wiring layer 16 at the contact portion becomes extremely low, thus leaving the wiring layer easily breakable. As is shown in FIG. 1C, wiring layer 16 is made thin on side wall portions 16A and 16B of contact hole 15. The thin film portion of wiring layer 16 may cause open failure and electromigration due to an increase in the current density, lowering the reliability of the contact portion. Further, the poor step coverage of the wiring layer may cause a cavity in contact hole 15 at the time of formation of wiring layer 16. In these circumstances, when an insulation film is formed on wiring layer 16 and a second wiring layer is formed on the insulation film, insulation between the two wiring layers may become deteriorate. In other words, if a cavity is formed as described above, cracks may easily occur in the insulation film between wiring layer 16 and the second wiring layer due to stress caused by high temperature or the like. In addition, moisture trapped in the cavity may corrode wiring layer 16, rendering the wiring defective.

(3) With the high integration of semiconductor devices, the thickness of the entire wiring layer 16 becomes small. However, since a reduction in the thickness of the wiring layer increases the current density, this results in the wiring layer being more susceptible to stress- and electro-migration, remarked low reliability of the contact portion.

The same problems as described above may occur in the case where a contact portion for a wiring layer and an upper wiring layer formed over the wiring layer is formed. However, in this case, it is free from the problem where Si atoms are precipitated at the interface between the silicon substrate and wiring layer, reducing the effective contact area, and where aluminum in the wiring layer absorbs Si atoms in the silicon substrate, thereby causing the PN junction to break.

SUMMARY OF THE INVENTION

An object of this invention is to provide a method for manufacturing semiconductor devices the electrical characteristics of which are not adversely affected or the reliability lowered even when a contact portion is made small in size.

According to one aspect of this invention, a method for manufacturing semiconductor devices comprises the steps of forming a first conductive layer on a semiconductor substrate; forming a first insulation film on the first conductive layer; forming a contact hole in the first insulation film formed on the first conductive layer; forming a semiconductor layer on the first insulation film having the contact hole formed therein; forming a second insulation film on the semiconductor layer; forming a planarization film on the second insulation film; selectively removing the planarization film by anisotropic etching, to leave part of the planarization film in, and filling, the contact hole; removing the second insulation film exposed by the anisotropic etching; forming a second conductive layer on the entire semiconductor structure; and patterning the second conductive layer and semiconductor layer, to form a laminated structure of wiring layer.

Since, according to the above manufacturing method, the metal wiring layer is not formed on the side wall portions of the contact hole, the wiring layer will not be made thin, in this way, breakage of the wiring layer and electromigration are both effectively eliminated. Further, since part of the planarization film fills the contact hole, the metal wiring layer can be made flat, reducing the electrical stress applied thereto. As a result, electrical characteristics and reliability of the contact portion are improved considerably.

DETAILED DESCRIPTION OF THE PREFERRED EMBODIMENTS

Figure 2A:
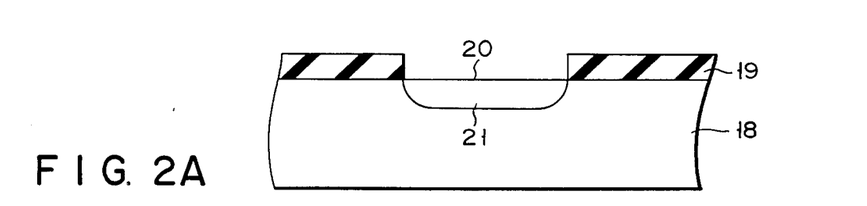
FIGS. 2A to 2H are cross-sectional views showing a method of manufacturing semiconductor devices according to a first embodiment of this invention.
Figure 2B:
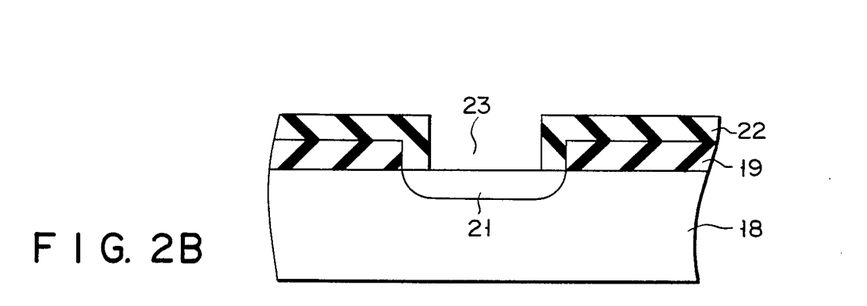
Figure 2C:
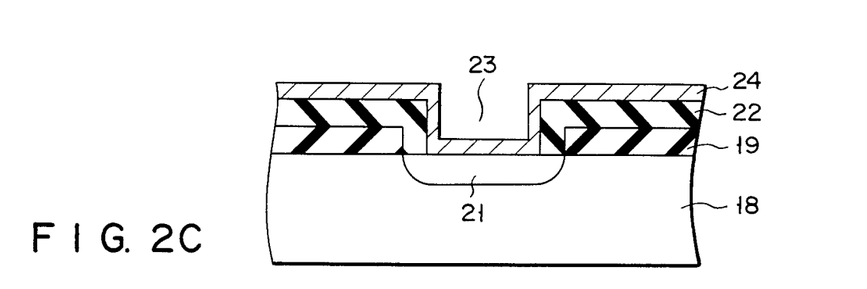

FIGS. 2A to 2H are cross-sectional views sequentially showing steps for manufacturing a contact portion of a semiconductor integrated circuit device according to a first embodiment of this invention. As is shown in FIG. 2A, element isolation region 19 is selectively formed on the main surface of a semiconductor substrate or P-type silicon substrate 18 having Miller indices (100) and a resistivity of 1 to 2 $\Omega\cdot$cm, thus defining element formation region 20. Then, an N-type impurity such as arsenic (As) is ion-implanted into the surface area of silicon substrate 18 in element formation region 20, with element isolation region 19 being used as a mask, to form high impurity concentration layer 21 under the conditions wherein the acceleration voltage is 50 KeV and the dose amount is $5 \times 10^{-15}$ cm$^{-2}$. Next, CVD-SiO$_2$ film 22 is formed on the resultant semiconductor structure by deposition. A photoresist film is then formed on CVD-SiO$_2$ 22 and patterned by use of a photolithographic method. As is shown in FIG. 2B, the photoresist film is used as a mask when an anisotropic etching process is effected in order to form contact hole 23 in CVD-SiO$_2$ film 22. After this, as is shown in FIG. 2C, polysilicon layer 24 is formed to a thickness of approx. 1000 Å by deposition on the entire surface of the resultant semiconductor structure. Arsenic (As) or boron (B) is then ion-implanted into polysilicon layer 24, with the acceleration voltage being 50 KeV and the dose amount $5 \times 10^{15}$cm$^{-2}$. With the ion-implantation, any unwanted film, such as a thermal oxide film formed on the interface between silicon substrate 18 and polysilicon layer 24, is destroyed and the resistance of polysilicon layer 24 reduced.

Figure 2D:
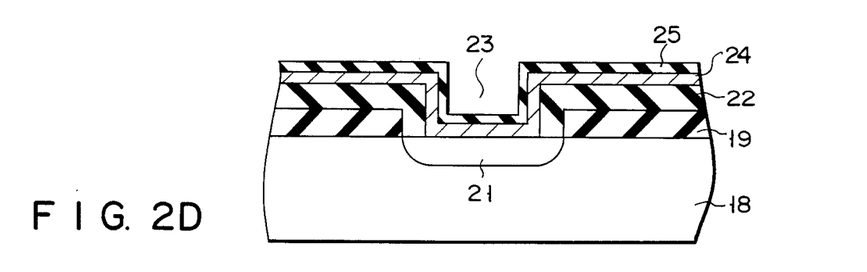
Figure 2E:
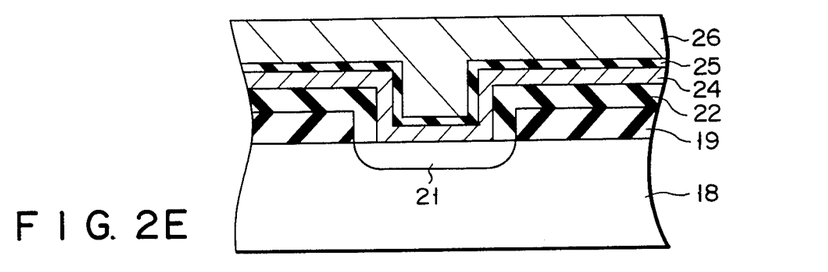
Figure 2F:
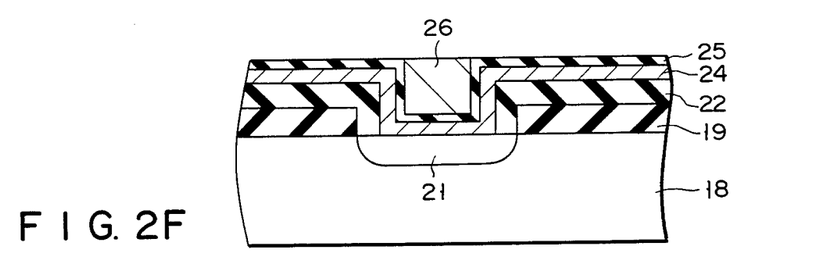
Figure 2G:
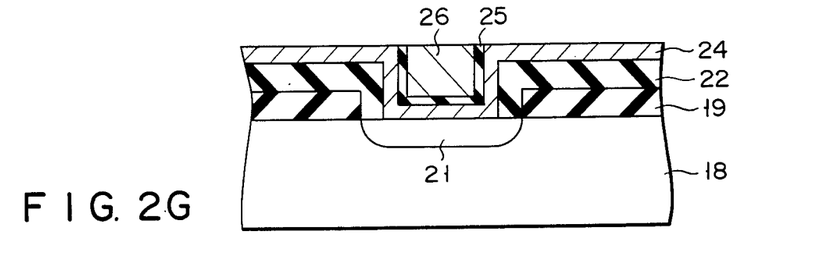

Nest, as is shown in FIG. 2D, polysilicon layer 24 is thermally oxidized to form oxide film 25 on the surface thereof. Then, as is shown in FIG. 2E, polysilicon layer 26 is formed as a planarization film to a thickness of 6000 Å, by means of an LPCVD method, and is etched by use of an anisotropic dry etching (RIE) method. At the time of this etching, thermal oxide film 25 functions as a stopper to stop etching for the flat portion, thus leaving a portion of polysilicon layer 26 in contact hole 23, as is shown in FIG. 2F. Next, as is shown in FIG. 2G, in order to form a wiring layer containing aluminum in contact with polysilicon layer 24, oxide film 25 is first etched using NH$_4$F, thereby removing an exposed portion of oxide film 25.

Figure 2H:
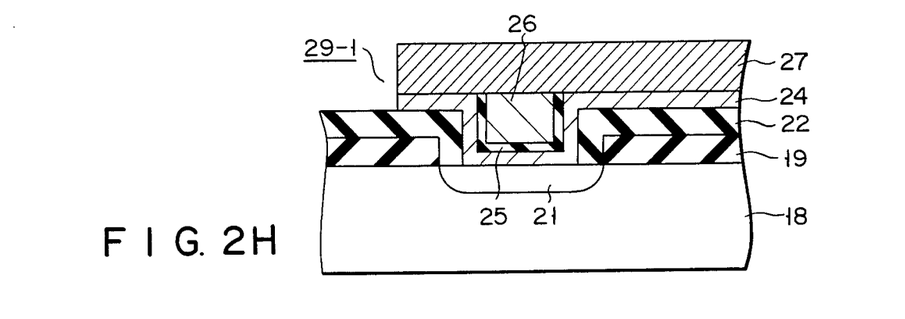

Next, an Al—Si layer or Al layer is formed on the entire surface of the resultant semiconductor structure, by means of a sputtering method, and is patterned to form wiring layer 27 by way of a photolithographic method using a photoresist film. Then, as is shown in FIG. 2H, polysilicon layer 24 formed on element isolation region 19 is etched so that it has the same pattern as that of wiring layer 27. The laminated structure 29-1 composed of patterned polysilicon layer 24 and wiring layer (Al—Si layer) 27 is used as a wiring layer.

Since, according to the manufacturing method described above, Al—Si layer 27 is not formed in direct contact with silicon substrate 18, Si atoms will not be precipitated from Al—Si layer 27 to the interface between silicon substrate 18 and polysilicon layer 24. Therefore, the resistance of the contact portion will not increase. Further, since silicon layer 18 is formed in contact with polysilicon layer 24, which can be formed in better contact with silicon than with aluminum, the resistance of the contact portion can be reduced. Since an impurity is doped from the upper surface of polysilicon layer 24, an impurity layer can be formed in the surface area of silicon substrate 18 in a self-alignment manner, with polysilicon layer 24 acting as a diffusion source, even if contact hole 23 is displaced from high impurity concentration layer 21. Therefore, even if a mask is set in a deviated position at the time of formation of contact hole 23, wiring layer 29-1 can be formed in close contact with impurity layer 21. Further, since Si atoms will not diffuse from silicon substrate 18 into Al—Si layer 27, the PN junction between substrate 18 and impurity layer 21 will not be destroyed. Al—Si layer 27 is not formed on the side walls of contact hole 23 and polysilicon layer 26 formed by the LPCVD method is formed to have the same thickness on the side walls as CVD-SiO$_2$ film 22, thus preventing the thickness on the side walls from being reduced, effectively suppressing open failure, stress- and electro-migration. Further, since contact hole 23 is filled with polysilicon layer 26, in order to planarize the upper surface, Al—Si layer 27 is very well planarized. Therefore, even if layer 27 can be formed thin, the occurrence of the open failure and electromigration due to increase in the current density need not be worried about. This is preferable from the stand point of reliability of the contact portion of the semiconductor integrated circuit device. In addition, since no cavity is formed in contact hole 23, the degree of insulation between the upper and lower wiring layers can be enhanced when an insulation film is formed on wiring layer 29-1 and the upper wiring layer is formed on this insulation film.

According to the manufacturing method as described above, the contact portion can be miniaturized without its electrical characteristics or reliability being adversely affected.

Figure 3A:
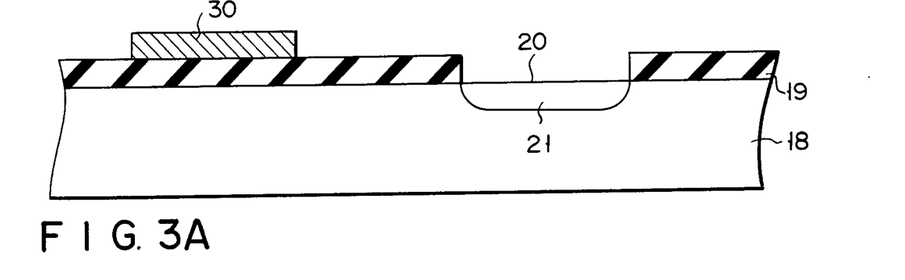
FIGS. 3A to 3H are cross-sectional views showing a method of manufacturing semiconductor devices according to a second embodiment of this invention.

FIGS. 3A to 3H sequentially show steps for forming contact portions in a semiconductor integrated circuit device according to a second embodiment of this invention. In the second embodiment, a contact portion for a wiring layer formed on element isolation region 19 and a metal wiring layer formed over the wiring layer is formed in addition to a contact portion for high impurity concentration region 21 and metal wiring layer (Al—Si layer or Al layer) 27 which is formed in the first embodiment. As shown in FIG. 3A, element isolation region 19 is first selectively formed on the main surface of P-type silicon substrate 18 having Miller indices (100) and the resistivity of 1 to 2 Ω·cm. Then, for example, arsenic (As) is ion-implanted into the surface area of silicon substrate 18 in element formation region 20 which is defined by region 19 with element isolation region 19 as a mask to form high impurity concentration layer 21 under a condition that an acceleration voltage is 50 KeV and the dose amount is $5 \times 10^{15}$ cm$^{-2}$. After this, a polysilicon layer is formed on element isolation region 19 and patterned by a photolithographic method to form polysilicon wiring layer 30.

Figure 3B:
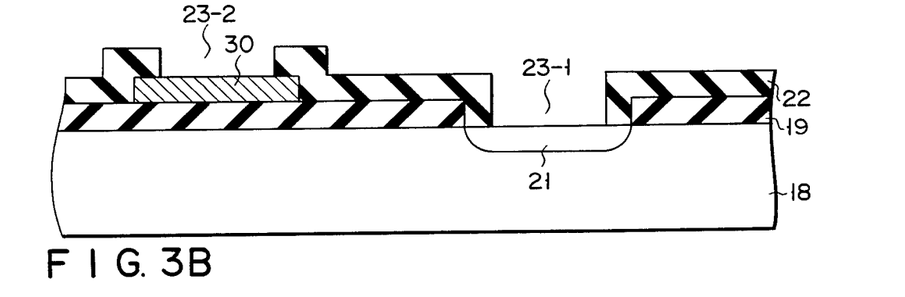
Figure 3C:
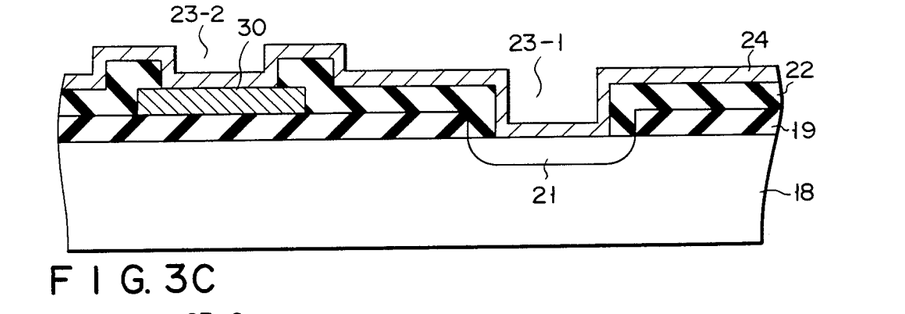

Next, CVD-SiO$_2$ film 22 is formed on the entire surface of the resultant semiconductor structure by deposition as shown in FIG. 3B. A photoresist film is formed by coating technique on CVD-SiO$_2$ 22 and then patterned by a photolithographic method. Then, an anisotropic etching process is effected with the photoresist film as a mask in order to form contact holes 23-1 and 23-2 in portions of CVD-SiO$_2$ film 22 which lie on impurity layer 21 and polysilicon wiring layer 30 as shown in FIG. 3B. After this, polysilicon layer 24 is formed to a thickness of approx. 1000 Å by deposition on the entire surface of the resultant semiconductor structure as shown in FIG. 3C. Arsenic (As) or boron (B) is ion-implanted into polysilicon layer 24 with the acceleration voltage of 50 KeV and dose amount of $5 \times 10^{15}$ cm$^{-2}$. With the ion-implantation, undesirable films such as native oxide films formed on the surface of wiring layer 30 and the interface between silicon substrat 18 and polysilicon layer 24 can be destroyed and the resistance of polysilicon layer 24 can be reduced.

Figure 3D:
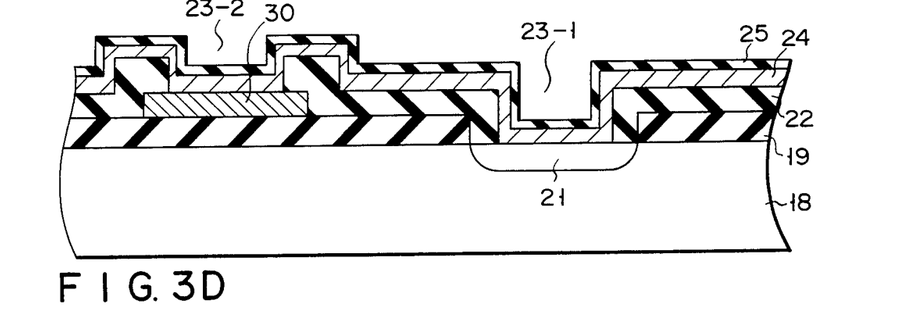
Figure 3E:
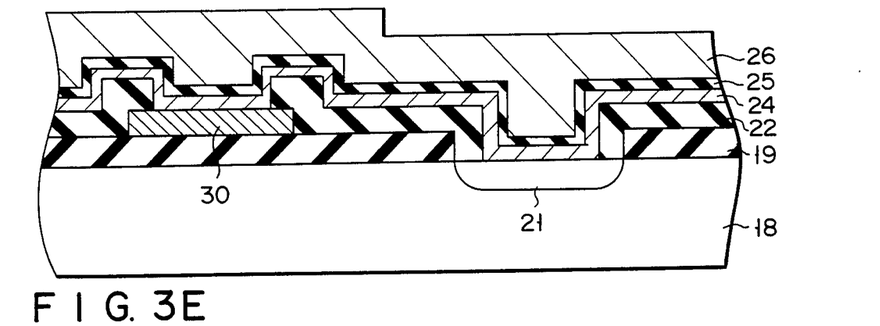
Figure 3F:
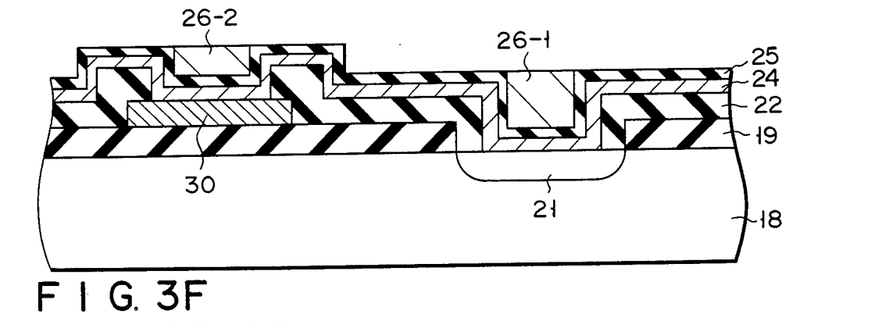
Figure 3G:
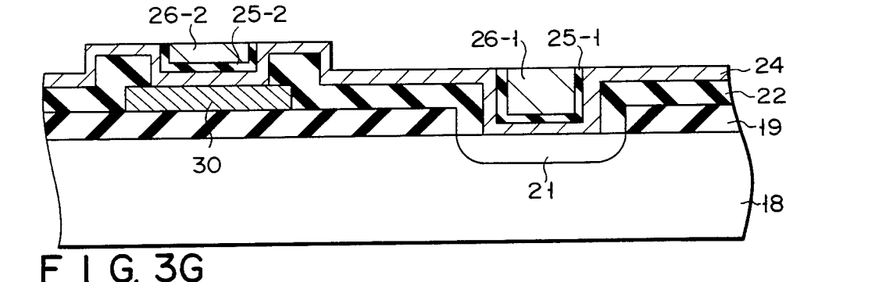

Then, polysilicon layer 24 is thermally oxidized to form oxide film 25 on the surface thereof as shown in FIG. 3D. As shown in FIG. 3E, for example, polysilicon layer 26 is formed as a planarization film to a thickness of 6000 Å by an LPCVD method, and polysilicon layer 26 is etched by an anisotropic dry etching (RIE) method. At the time of anisotropic dry etching, thermal oxide film 25 functions as a stopper to stop etching for the flat portion, thus leaving portions 26-1 and 26-2 of polysilicon layer 26 in contact holes 23-1 and 23-2 as shown in FIG. 3F. Next, in order to form a wiring layer containing aluminum in contact with polysilicon layer 24, oxide film 25 is first etched using NH$_4$F, thus removing an exposed portion of oxide film 25 as shown in FIG. 3G.

Figure 3H:
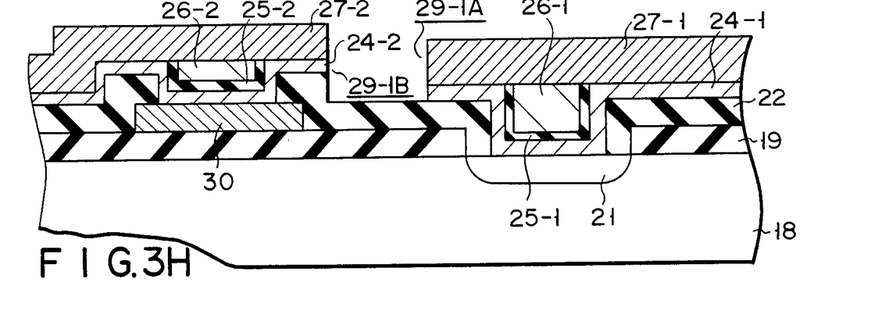

An Al—Si layer or Al layer is formed on the entire surface of the resultant semiconductor structure by a sputtering method and the Al—Si layer or Al layer is patterned to form wiring layers 27-1 and 27-2 by the photolithographic method using a photoresist film. Then, polysilicon layer 24 formed on element isolation region 19 is etched to have the same pattern as those of wiring layers 27-1 and 27-2 as shown in FIG. 3H. The laminated structure 29-1A of patterned polysilicon layer 24-1 and wiring layer 27-1 and the laminated structure 29-1B of polysilicon layer 24-2 and wiring layer 27-2 are used as wiring layers.

With the manufacturing method described above, the contact portion between high impurity concentration layer 21 and metal wiring layer 27-1 has the same effect as described in the first embodiment. The contact portion between metal wiring layer 27-1 and polysilicon wiring layer 30 formed on element isolation region 19 is free from the problem caused by the connection between the silicon layer and the wiring layer containing aluminum. Therefore, effects for solving the problem cannot be obtained, but the same effects as described before can be attained. Thus, contact portions can be attained in which the electrical characteristic and reliability will not be lowered when they are miniaturized. Further, it is possible to attain a new effect of achieving planarization by the same manufacturing step even when contact portions are formed in contact holes with different depths.

In the second embodiment, lower wiring layer 30 is formed of polysilicon, but the same effect can be attained when the wiring layer is formed of other conductive material such as aluminum or Al—Si.

Figure 4A:
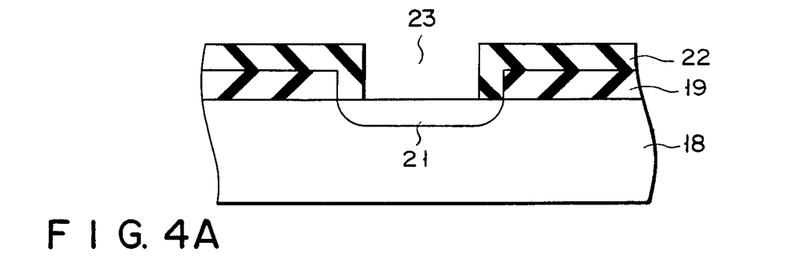
FIGS. 4A to 4H are cross-sectional views showing a method of manufacturing semiconductor devices according to a third embodiment of this invention.
Figure 4B:
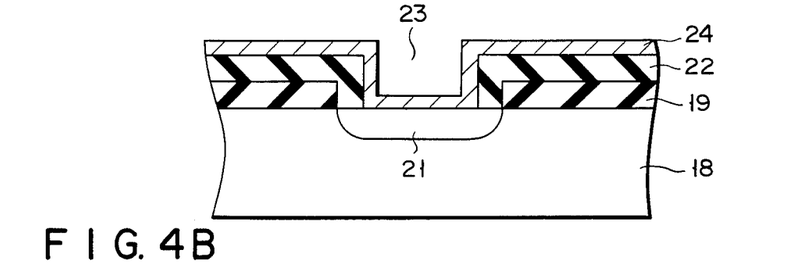
Figure 4C:
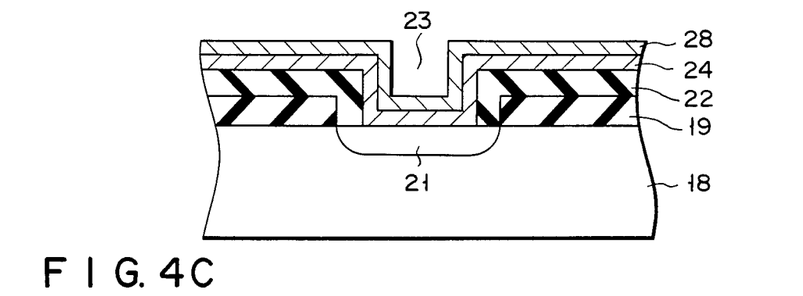
Figure 4D:
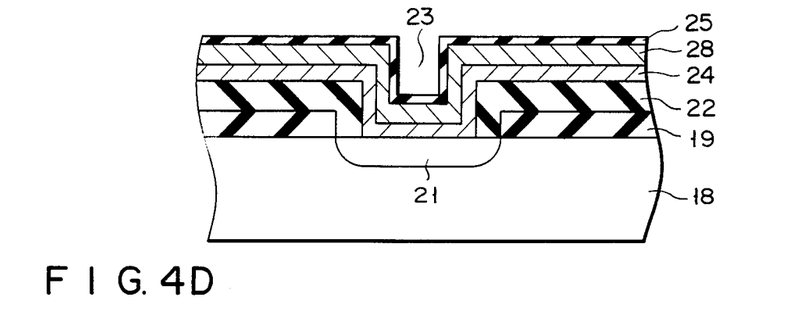
Figure 4E:
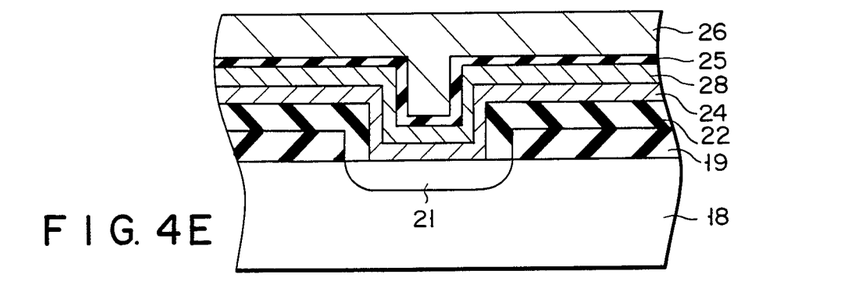
Figure 4F:
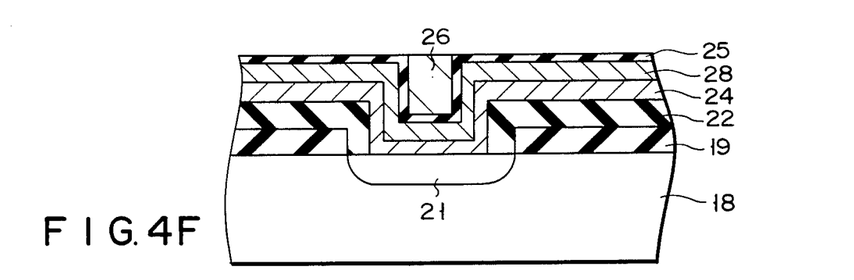
Figure 4G:
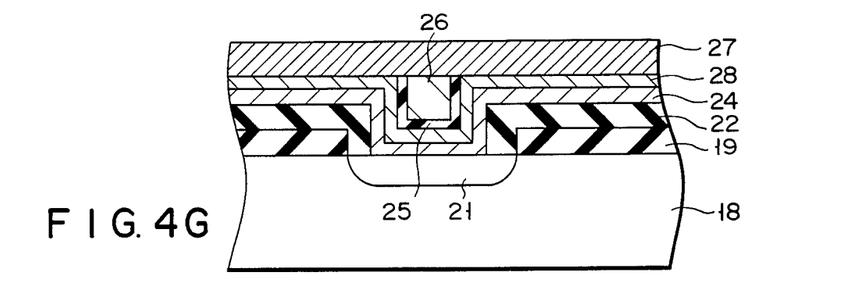
Figure 4H:
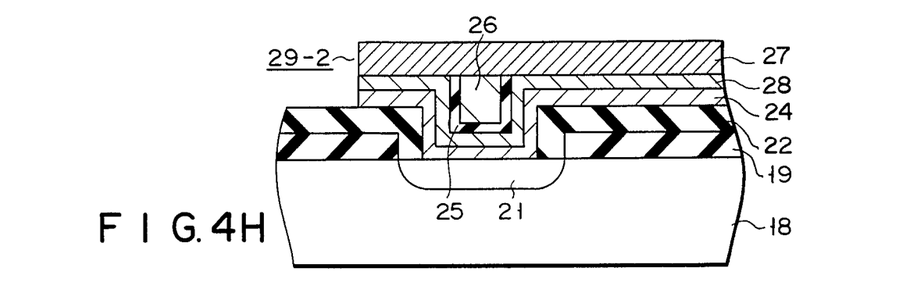

FIGS. 4A to 4H show a third embodiment of this invention is which a silicide film such as a MoSi film is formed between polysilicon layer 24 and thermal oxide film 25 in the embodiment of FIGS. 2A to 2H. The same portions in FIGS. 4A to 4H as in FIGS. 2A to 2H are denoted by the same reference numerals. Steps shown in FIGS. 4A and 4B for forming polysilicon layer 24 correspond to those shown in FIGS. 2A to 2C. MoSi film 28 with a thickness of approx. 200 Å is formed on polysilicon film 24 by a sputtering method as shown in FIG. 4C. Then, MoSi film 28 is oxidized to form thermal oxide film 25 with a thickness of 1000 Å on MoSi film 28, as shown in FIG. 4D. Next, polysilicon layer 26 is formed on the entire surface of the resultant semiconductor structure to a thickness of, for example, 6000 Å by an LPCVD method as shown in FIG. 4E. Then, polysilicon layer 26 is removed by an anisotropic dry etching method to expose oxide film 25. Thus, part of polysilicon layer 26 is left behind in contact hole 23, that is, contact hole 23 is filled with the polysilicon layer as shown in FIG. 4F. After this, exposed portion of oxide film 25 is etched out to expose MoSi film 28, and Al—Si layer or Al layer 27 is formed on MoSi film 28 to a thickness of approx. 4000 Å as shown in FIG. 4G by a sputtering method. for example. Then, photoresist is coated on the entire semiconductor structure to form a photoresist film which in turn is patterned by a photolithographic method, and the photoresist pattern thus obtained is used as a mask to effect an anisotropic dry etching process. By this anisotropic dry etching process, wiring layer 29-2 formed of the laminated structure including Al—Si layer 27/MoSi film 28/polysilicon layer 24 is formed, thus completing the formation process of the contact portion of the semiconductor integrated circuit device.

With this manufacturing method, the contact portion has basically the same effect as that formed by the manufacturing method shown in FIGS. 2A to 2H. Further, since Al—Si layer 27 is formed only on contact hole 23 and MoSi film 28, the crystal of aluminum can be made fine as compared with the case where Al—Si layer 27 is formed on the silicon substrate or polysilicon layer. Thus, the stress on Al—Si layer 27 can be reduced and accordingly the stress- and electro-migration can be reduced. Further, the silicide film and polysilicon layer 24 which are highly resistive to the electromigration are formed under the Al—Si layer, and therefore resistance to the electromigration and reliability can be improved.

In the embodiment described above, MoSi film 28 is used as the silicide film, but other silicide films such as WSi, TiSi, and PtSi can be used to attain the same effect.

Figure 5A:
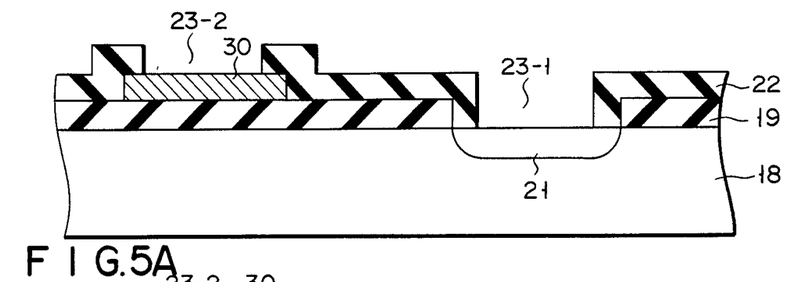
FIGS. 5A to 5H are cross-sectional views showing a method of manufacturing semiconductor devices according to a fourth embodiment of this invention.
Figure 5B:
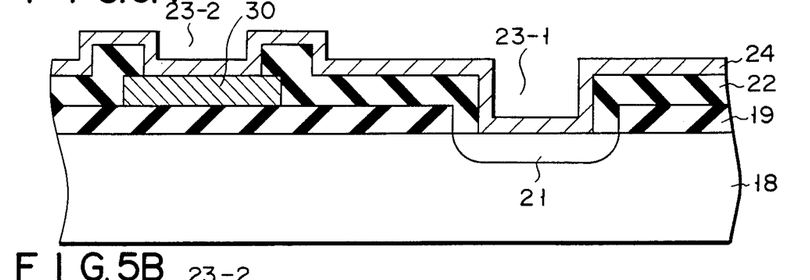
Figure 5C:
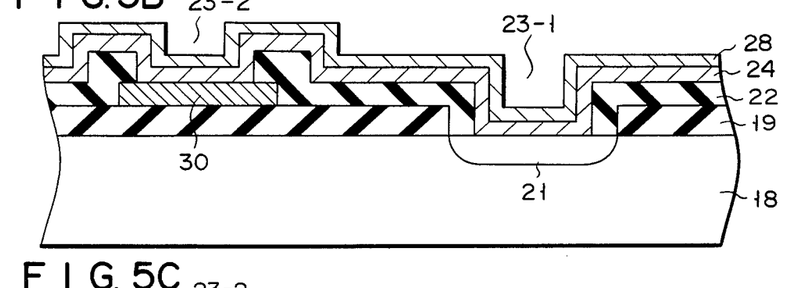
Figure 5D:
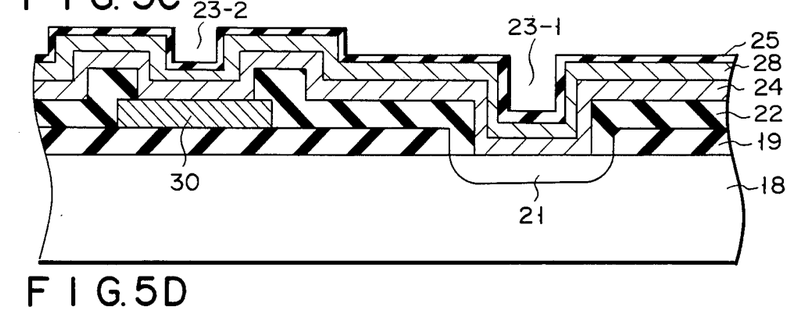
Figure 5E:
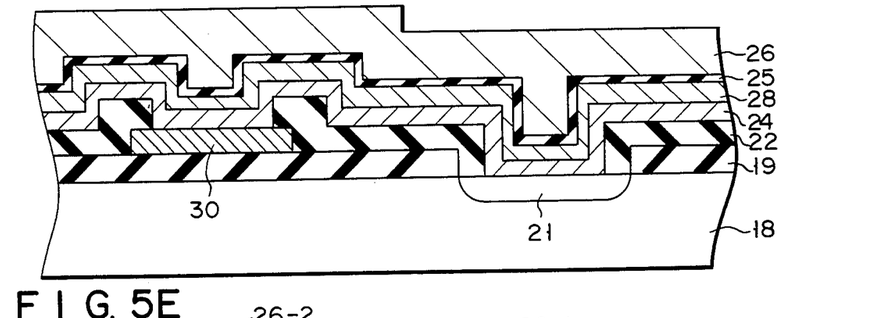
Figure 5F:
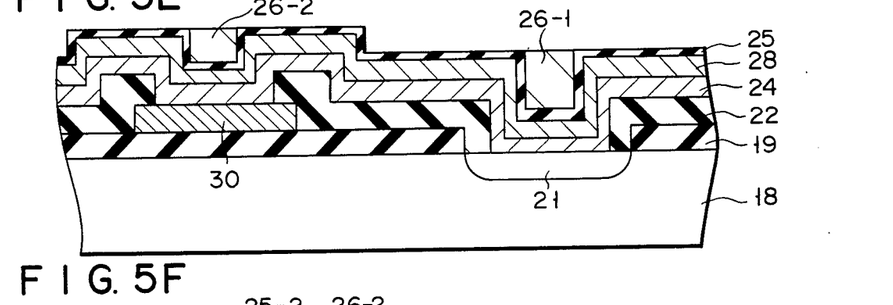
Figure 5G:
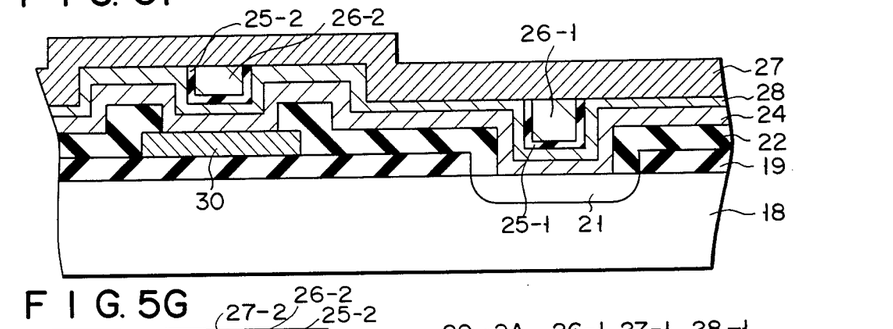

FIGS. 5A to 5H show a fifth embodiment of this invention in which a silicide film such as a MoSi film is formed between polysilicon layer 24 and thermal oxide film 25 which are used in the embodiment shown in FIGS. 3A to 3H. Portions in FIGS. 5A to 5H which are the same as those in FIGS. 3A to 3H are denoted by the same reference numerals, and steps shown in FIGS. 5A and 5B for forming polysilicon layer 24 correspond to those shown in FIGS. 3A to 3C. As shown in FIG. 5C, MoSi film 28 is formed to a thickness of 200 Å on polysilicon layer 24 by a sputtering method. Then, MoSi film 28 is thermally oxidized to form oxide film 25 of 1000 Å on MoSi film 28 as shown in FIG. 5D. Next, polysilicon layer 26 is formed on the entire surface of the resultant semiconductor structure to a thickness of, for example, 6000 Å by an LPCVD method as shown in FIG. 5E. Then, polysilicon layer 26 is removed by an anisotropic dry etching method to expose oxide film 25. Thus, parts 26-1 and 26-2 of polysilicon layer 26 is left behind in contact holes 23-1 and 23-2, that is, contact holes 23-1 and 23-2 are filled with the polysilicon layer as shown in FIG. 5F. After this, exposed portion of oxide film 25 is etched out to expose MoSi film 28, and Al—Si layer or Al layer 27 is formed on MoSi film 28 to a thickness of approx. 4000 Å as shown in FIG. 5G by a sputtering method, for example. Then, photoresist is coated on the entire semiconductor structure to form a photoresist film which in turn is patterned by a photolithographic method, and the photoresist pattern is used as a mask to effect an anisotropic dry etching process. By this anisotropic dry etching process, wiring layer 29-2A formed of the laminated structure including Al—Si layer 27-1/MoSi film 28-1/polysilicon layer 24-1 and wiring layer 29-2B formed of the laminated structure including Al—Si layer 27-2/MoSi film 28-2/polysilicon layer 24-2 are formed.

Figure 5H:
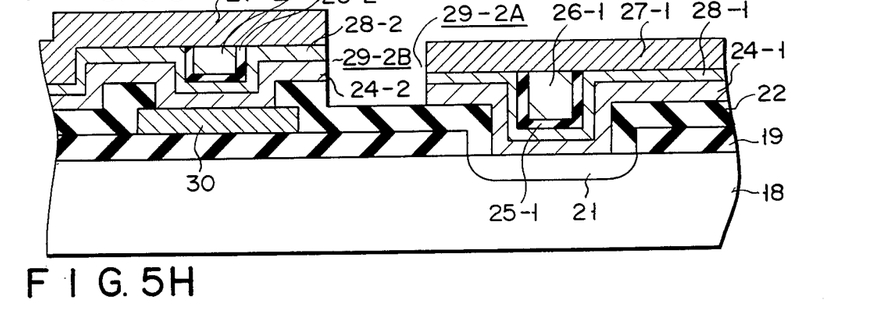

With this manufacturing method, the contact portions have basically the same effect as the contact portion formed by the manufacturing method in the second embodiment. Further, as described in the third embodiment, since Al—Si layers 27-1 and 27-2 are formed only on contact holes 23-1 and 23-2 and MoSi films 28-1 and 28-2, the stress and electromigration can be reduced and the reliability can be further enhanced.

In the first to fourth embodiments, high impurity concentration layer 21 is formed of N-type, but it is possible to use a P-type high impurity concentration layer when silicon substrate 18 is of N-type. At this time, it is necessary to use an impurity of the same conductivity type as the P-type impurity concentration layer or P-type impurity as an impurity which is doped into polysilicon layer 24. Further, this invention can also be applied to a CMOS semiconductor device.

What is claimed is:

1. A method of manufacturing semiconductor devices, comprising the steps of:
   forming a first conductive layer on a semiconductor substrate;
   forming a first insulation film on said first conductive layer;
   forming at least one contact hole in said first insulation film formed on said first conductive layer;
   forming a semiconductor layer on said first insulation film having said contact hole formed therein;
   forming a second insulation film on said semiconductor layer;
   forming a planarization film on said second insulation film;
   selectively removing said planarization film by anisotropic etching, to leave part of said planarization film in, and filling, said contact hole;
   removing a portion of said second insulation film exposed by the anisotropic etching;
   forming a second conductive layer on substantially the entire surface of the resultant semiconductor structure; and
   patterning said second conductive layer and semiconductor layer, to form a laminated structure of a wiring layer.

2. A method of manufacturing semiconductor devices according to claim 1, which further comprises a step in which a silicide layer is formed on said semiconductor layer after said semiconductor layer has been formed, and in which said second insulation film is formed on said silicide layer.

3. A method of manufacturing semiconductor devices according to claim 2, wherein said silicide layer is formed of a compound of silicon and refractory metal.

4. A method of manufacturing semiconductor devices according to claim 1, wherein said first conductive layer is formed in the surface area of said semiconductor substrate and is formed of an impurity layer having a conductivity type opposite to that of said semiconductor substrate.

5. A method of manufacturing semiconductor devices according to claim 1, which further comprises a step of forming an insulation film on said semiconductor substrate, and in which said first conductive layer is formed of a polysilicon layer formed on said insulation film.

6. A method of manufacturing semiconductor devices according to claim 1, wherein said semiconductor layer is formed of polysilicon containing an impurity of the same conductivity type as said semiconductor substrate.

7. A method of manufacturing semiconductor devices according to claim 1, wherein said planarization film is formed of polysilicon.

8. A method of manufacturing semiconductor devices according to claim 1, wherein said second conductive layer is formed of metal including aluminum.

9. A method of manufacturing semiconductor devices comprising the steps of:
   forming an element isolation region on the main surface of a semiconductor substrate of a first conductivity type;
   forming an impurity layer of a second conductivity type in the surface area of a portion of said semiconductor substrate which lies in an element region defined by said element isolation region;
   forming a first insulation film on substantially the entire surface of the resultant semiconductor structure;
   forming at least one contact hole in said first insulation film formed on said impurity layer;
   forming a semiconductor layer of the same conductivity type as said impurity layer on said first insulation film having said contact hole formed therein;
   forming a second insulation film on said semiconductor layer;
   forming a planarization film on substantially the entire surface of said second insulation film;
   selectively removing said planarization film by anisotropic etching, to leave part of said planarization film in, and filling, said contact hole;
   removing a portion of said second insulation film exposed by the anisotropic etching;

forming a conductive layer on substantially the entire surface of the resultant semiconductor structure; and patterning said conductive layer and semiconductor layer, to form a laminated structure of a wiring layer.

10. A method of manufacturing semiconductor devices according to claim 9, which further comprises a step in which a silicide layer is formed on said semiconductor layer after said semiconductor layer has been formed, and in which said second insulation film is formed on said silicide layer.

11. A method of manufacturing semiconductor devices according to claim 10, wherein said silicide layer is formed of a compound of silicon and refractory metal.

12. A method of manufacturing semiconductor devices acording to claim 9, wherein said semiconductor layer is formed of polysilicon.

13. A method of manufacturing semiconductor devices according to claim 9, wherein said planarization film is formed of polysilicon.

14. A method of manufacturing semiconductor devices according to claim 9, wherein said second conductive layer is formed of metal including aluminum.

15. A method of manufacturing semiconductor devices, comprising the steps of:
  forming a first conductive layer on a first insulation film;
  forming a second insulation film on substantially the entire surface of the resultant semiconductor structure;
  forming at least one contact hole in said second insulation film formed on said first conductive layer;
  forming a semiconductor layer on said second insulation film having said contact hole formed therein;
  forming a third insulation film on said semiconductor layer;
  forming a planarization film on substantially the entire surface of said third insulation film;
  selectively removing said planarization film by anisotropic etching, to leave part of said planarization film in, and filling, said contact hole;
  removing a portion of said third insulation film exposed by the anisotropic etching;
  forming a second conductive layer on substantially the entire surface of the resultant semiconductor structure; and
  patterning said second conductive layer and semiconductor layer, to form a laminated structure of a wiring layer.

16. A method of manufacturing semiconductor devices according to claim 15, which further comprises a step in which a silicide layer is formed on said semiconductor layer after said semiconductor layer has been formed, and in which said second insulation film is formed on said silicide layer.

17. A method of manufacturing semiconductor devices according to claim 16, wherein said silicide layer is formed of a compound of silicon and refractory metal.

18. A method of manufacturing semiconductor devices according to claim 15, wherein said semiconductor layer is formed of polysilicon containing an impurity.

19. A method of manufacturing semiconductor devices according to claim 15, wherein said planarization film is formed of polysilicon.

20. A method of manufacturing semiconductor devices according to claim 15, wherein said second conductive layer is formed of metal including aluminum.

* * * * *